United States Patent [19]

Kokawa

[11] 3,954,587

[45] May 4, 1976

[54] ELECTRODEPOSITION COATING METHOD OF PHOTOCURING COMPOSITION

[75] Inventor: Tomoo Kokawa, Hiratsuka, Japan

[73] Assignee: Kansai Paint Company, Amagasaki, Japan

[22] Filed: Jan. 9, 1973

[21] Appl. No.: 322,115

[30] Foreign Application Priority Data

Jan. 10, 1972 Japan................................. 47-4683

[52] U.S. Cl. ............................................... 204/181
[51] Int. Cl.² ........................................ C25D 13/06
[58] Field of Search ..................................... 204/181

[56] References Cited

UNITED STATES PATENTS

| 3,492,213 | 1/1970 | Johnson ............................. 204/181 |
| 3,554,886 | 1/1971 | Colomb et al. ................. 204/159.12 |
| 3,558,741 | 1/1971 | Holub et al. ......................... 204/181 |

Primary Examiner—Howard S. Williams
Attorney, Agent, or Firm—Wigman & Cohen

[57] ABSTRACT

Electrodeposition coating method of photocuring composition to form excellent and uniform coating films on the surfaces of electroconductive articles, which comprises the steps of: immersing said electroconductive article into an electrodeposition coating bath which contains, as the principal components, water soluble or water dispersible film forming polymerizable unsaturated resin, water insoluble photopolymerization initiator, and a polyfunctional unsaturated compound insoluble in water; forming electrodeposition coating film on the surface of the article by supplying electric current to the article as an anode; and irradiating actinic rays to the coating film on the article to cause the curing of the coating film by photopolymerization.

11 Claims, No Drawings

ELECTRODEPOSITION COATING METHOD OF PHOTOCURING COMPOSITION

This invention relates to an electrodeposition coating method of photocuring composition. More particularly, the invention relates to an improved method which is characterized in that an electroconductive article which is connected to the positive wire is applied with the photocuring composition by electrodeposition, thereafter the coated film of the composition on the article is irradiated with actinic rays to cause photopolymerization, thereby obtaining a hardened coating film on the surface of the article.

In the prior art, the photocuring compositions are generally applied on articles to be coated through the physical methods such as spraying, brushing, dipping and flowing. In these coating methods, however, it is difficult to apply the coating film uniformly on the surface of the article, which is especially true in case of the article being of a complicated configuration. And further, in these methods, it is also difficult to control the coating film within a desired thickness.

Therefore, it is the principal object of the present invention to remove these disadvantages caused in such conventional methods.

Another object of the invention is to propose an improved method for applying the photocuring composition which is far advantageous as compared with those in the prior art.

Further object of the present invention is to propose an improved method in which a novel composition being suitable for the electrodeposition coating is used.

Still further object of the present invention is to propose an improved method using the composition which can be applied on the surface of an electroconductive article by electrodeposition with a uniform and controlled thickness.

Pursuant to the above-mentioned objects, the method of the present invention comprises the steps of:
  immersing an electroconductive article into an electrodeposition coating bath which comprises, as the principal ingredients, (a) water soluble or water dispersible film forming polymerizable unsaturated resin having an acid value of 30 to 240, an unsaturation equivalent of about 250 to 2000 and a number average molecular weight of about 1000 to 6000, (b) water insoluble photopolymerization initiator, (c) a polyfunctional unsaturated compound insoluble in water, and (d) water;
  forming electrodeposition coating film on the surface of the electroconductive article by supplying electric current to the article as an anode; and
  applying actinic rays to the coating film on the article to cause the curing of the coating film by photopolymerization.

The water soluble or water dispersible polymerizable unsaturated resin having an acid value of 30 to 240, preferably 60 to 110, an unsaturation equivalent of about 250 to 2000, and a number average molecular weight of about 1000 to 6000, preferably 2000 to 3000, has ionic activity, and the resin has unsaturations of oil or fatty acid having conjugated or non-conjugated double bonds.

There are following materials. For the first place, there is an addition product which is prepared by reacting $\alpha,\beta$-ethylenically unsaturated dibasic acids or their anhydrides with unsaturated bonds in the fatty acid chain of an ester which is prepared from epoxy resin having epoxy groups and unsaturated fatty acid. The addition product obtained has molecular weight of about 1500 to 6000, acid value of 30 to 240 and the unsaturation equivalent of about 250 to 2000.

As the unsaturated fatty acids, there are for example, oleic acid, linoleic acid, linolenic acid, eleostearic acid, licanic acid, ricinoleic acid and arachidonic acid. The unsaturated fatty acids are used in a ratio of 1.0 to 2.0 moles based on epoxy group of 1.0 mole. Further, as the $\alpha,\beta$-ethylenically unsaturated dibasic acids or their anhydride, there are, for example, maleic acid, maleic anhydride and fumaric acid. In this vehicle component, the acid value thereof is regulated by the addition amount of the $\alpha,\beta$-ethylenically unsaturated dibasic acids or their anhydrides, and the unsaturation equivalent is regulated by the kinds and the amounts of unsaturated fatty acids. The $\alpha,\beta$-ethylenically unsaturated dibasic acids are generally used in a ratio of 5 to 20% by weight based on weight of the addition product obtained.

As for the second vehicle component, there is fatty acid modified alkyd resin having high acid value. This resin is prepared by esterifying the hydroxyl group in the skeletal chain of the polyesters which are prepared from polyhydric alcohols each having two or more of hydroxyl groups and a mixture of dibasic acids each having two carboxyl groups and polybasic acids each having three or more carboxyl groups with using unsaturated fatty acids. In this case, the molar ratio of the acid components to the alcoholic components is preferably within the range of 0.8–1.0. The fatty acid modified alkyd resin has a number average molecular weight of about 800 to 4000, an unsaturation equivalent of about 250 to 2000, an acid value of about 30 to 100 and an oil length of about 30 to 60.

In this reaction, the acid value of the reaction product is regulated by the kind and amount of the polybasic acid, and the unsaturation equivalent is regulated by the addition amount of the unsaturated fatty acid. While, the acid value can be imparted also by half-esterifying dibasic acid to fatty acid modified alkyd resin which has excess hydroxyl group against carboxyl group. In this instance, there are as the dibasic acids for example, phthalic anhydride, isophthalic acid, terephthalic acid, succinic acid and sebacic acid, and as the polybasic acids, trimellitic acid, pyromellitic acid and pyromellitic anhydride, and further as the polyhydric alcohol, ethylene glycol, propylene glycol, butylene glycol, neopentyl glycol, glycerol, trimethylol ethane, trimethylol propane, pentaerythritol, sorbitol and diglycerol. Furthermore, as the unsaturated fatty acids, those which are used in the preparation of the addition product are employed.

As for the third vehicle component, modified maleinized oil can be used. The modified maleinized oil is a reaction product of maleic anhydride and oil having conjugated double bonds or non-conjugated double bonds. This reaction product is modified with styrene, vinyl toluene, cyclopentadiene, acrylic esters, methacrylic esters or the like by addition reaction in order to improve the curing property of the coating film. The modified maleinized oil thus obtained has an acid value of about 30 to 200 and an unsaturation equivalent of about 250 to 2000. In this modified maleinized oil, the acid value thereof is regulated by the addition amount of the maleic anhydride and the unsaturation equivalent is regulated by the amount of unsaturated bonds in the oil. The oils as used in this case are, for example, linseed oil, tung oil, soybean oil, castor oil, coconut oil, sardine oil, cotton seed oil and hemp seed oil.

With regard to the above-mentioned vehicle components, when the acid value is less than 30, the water dispersibility is lowered, and when the acid value is more than 240, the electrodeposition becomes difficult. When the unsaturation equivalent is less than about 250, the film forming property is lowered and when it is more than about 2000, the curing property is lowered. Further, when the number average molecular weight thereof becomes less than about 1000, the film forming property is lowered. Therefore, the aforementioned ranges are suitable.

In order to impart water solubility or water dispersibility to the vehicle components of the present invention, the carboxyl group in the skeletal chain of the vehicle component is neutralized by using a neutralizing agent such as alkali. For this neutralizing agent, for example, alkanol amines such as monoethanol amine, diethanol amine and triethanol amine, alkyl amines such as monoethyl amine, diethyl amine, triethyl amine, diisopropyl amine, trimethyl amine and diisobutyl amine, alkylalkanol amine such as dimethylamino ethanol, alicyclic amine such as cyclohexylamine, alkali metal hydroxides such as sodium hydroxide and potassium hydroxide and ammonia can be used solely or as a mixture thereof. The amount of the neutralizing agent to be used may be in the range of 0.4 to 1.0 equivalent against 1 mole of the carboxyl group contained in the skeletal chain of the vehicle component. When the amount of the agent is less than 0.4 equivalent, the water dispersibility is lowered and the electrodeposition becomes difficult, while if it exceeds 1.0 equivalent, the storage stability is decreased.

In order to improve the fluidity of water soluble or water dispersible vehicle components, several hydrophilic solvents can be added, and as such solvents, there are, for example, isopropanol, n-butanol, tert-butanol, methoxyethanol, ethoxyethanol, butoxyethanol, diethylene glycol, methyl ether, dioxane and tetrahydrofuran. Further, it is preferable that the amount of said hydrophilic solvent may be within the range of 300 parts by weight or less against 100 parts by weight of the vehicle component.

As for the above-mentioned water insoluble photopolymerization initiators, benzoin, benzoin methyl ether, benzoin ethyl ether, benzyl, diphenyl disulfide, tetramethylthiuram monosulfide, diacetyl, eosine, thionine, Michler's ketone, anthraquinone, chloroanthraquinone, methyl anthraquinone, and the like can be used. The amount of the photopolymerization initiator as used may be within the range of 0.1 to 10 parts by weight against 100 parts by weight of the vehicle component (as solid). When the amount of the initiator is less than 0.1 part by weight, the curing property is lowered and when it is more than 10 parts by weight, the mechanical strength of the coating film after the curing is reduced. If a water soluble photopolymerization initiator is used, it can not be electrodeposited in a uniformly mixed condition with the vehicle component, therefore it is not suitable.

The water soluble or water dispersible photocuring composition of the present invention comprises, as the principal components, the vehicle component which is imparted with water solubility or water dispersibility, the water insoluble photopolymerization initiator, polyfunctional unsaturated compounds and water. The polyfunctional unsaturated compounds are used together so as to improve the curing property of the composition. Especially in case that the addition product of fatty acid ester of epoxy resin and $\alpha,\beta$-ethylenically unsaturated acid, the alkyd resin having high acid value which is modified with fatty acid having unsaturated double bonds, or modified maleinized oil is used as the vehicle component, it is indispensable to use the polyfunctional unsaturated compound together. This polyfunctional unsaturated compound must be insoluble in water since the compound is not deposited uniformly on the article to be coated if the compound is soluble in water. The polyfunctional unsaturated compound which is used in the present invention is a compound which has two or more of polymerizable unsaturated bonds, or a mixture of the compound and another compound which has a single polymerizable unsaturated bond. The compounds each having two or more of polymerizable unsaturated bonds are, for example, ethylene glycol dimethacrylate, diethylene glycol dimethacrylate, triethylene glycol dimethacrylate, neopentyl glycol dimethacrylate, trimethylolethane trimethacrylate, tetramethylolmethane tetramethacrylate, 1,6-hexanediol diacrylate and divinyl benzene. Further the compounds which are prepared by reacting equimolar amounts of diisocyanates such as tolylene diisocyanate, xylene diisocyanate and hexamethylene diisocyanate, and compounds each having polymerizable unsaturated bond and hydroxyl group, then adding reaction product to polyhydric alcohols such as ethylene glycol, neopentyl glycol, glycerol, trimethylol ethane and pentaerythritol or oxides of polyhydric alcohols such as dimethylol propionic acid and trimethylol acetic acid, can be used as said compound having two or more of polymerizable unsaturated bonds. Furthermore, the compound having one polymerizable unsaturated bond such as styrene, vinyl toluene, acrylic esters and methacrylic esters can be used as a mixture with polyfunctional unsaturated compound. The compound having one polymerizable unsaturated bond is mixed with polyfunctional unsaturated compound to obtain a mixture (hereinafter referred to as merely "polyfunctional unsaturated compound"). The mixture has a carbon-carbon double bond functionality of more than 2 when used as the mixture. It is preferable to use 50 parts by weight or less of the polyfunctional unsaturated compound. In case that more than 50 parts by weight of the polyfunctional unsaturated compound is used, the water dispersibility of the compound is lowered as the total electrodeposition bath composition and physical properties are reduced, therefore it is not preferable. When the water insoluble polyfunctional unsaturated compound is mixed into the solution of vehicle component, the water insoluble polyfunctional unsaturated compound is to be added little by little in order to disperse uniformly.

The water soluble or water dispersible photocuring composition of the present invention can be colored by dispersing, for example, pigments. The amount of said pigments as used is preferably not more than 20 parts by weight to 100 parts by weight of the vehicle component. When more than 20 parts by weight of the pigments are used, it is not desirable as the photocuring property is reduced by prevention of light transmission to inner portion of the coated film.

Now the process for the electrodeposition of the present invention will be explained in the following. The electrodeposition coating bath containing the water soluble or water dispersible photocuring composition as the main component is controlled such that the pH is 6.5 to 9, the concentration as solid contents is 5 to 20% by weight and the temperature of bath is 15 to 40°C. Then the article to be coated is immersed into this electrodeposition bath, and the article is connected to the positive wire to make it positive electrode and the bath is to the negative wire as negative electrode or negative electrode is separately immersed into the bath. Then a direct current of 40 to 400 volts is supplied to the electrode, thereby the photocuring composition which is dissolved or dispersed in the bath is deposited on the surface of the article to form a coating film. In this case, the period to supply the electric current may be about 30 seconds to 10 minutes. After the electrodeposition, the article is taken out from the deposition bath and rinsed with water, and the water which is contained in the coating film is removed by, for example, blowing hot air. Thereafter, the coating film is irradiated with actinic rays to cure the coating film.

The wave length of actinic rays which being used in the method of the present invention may be about 3000 to 5000 A which varies according to the absorption of the photopolymerization initiator as used. As the light sources for this, there are sunlight, mercury lamp, xenon lamp, arc lamp and the like. The curing of the coating film by the actinic rays can be carried out within several minutes.

As disclosed in the above, the present invention is characterized in that the electrodeposition coating is formed by using a solution or dispersion of photocuring composition, and the electrodeposition coating is cured through photopolymerization by the application of actinic rays. According to the present invention, any articles which have complicated shapes can be applied easily with uniform coatings of photocuring composition and the curing time for the coating film is quite short as compared with those in the conventional methods such as air drying, heat curing. Further, the thickness of the coating film can be controlled at will by changing the conditions for electrodeposition.

Furthermore, in the present invention, because the oil or fatty acid having conjugated or non-conjugated double bonds is used as an indispensable component for modifying ingredient, the electrodeposition coating is cured through cross-linking in air by the irradiation of actinic rays, and the polyfunctional unsaturated compound is scarcely cured by irradiation of actinic rays without using oil or fatty acid having conjugated or non-conjugated double bonds.

Still further, the vehicle component of the present invention is excellent in its adherence to the surface of the article as the acid value of the component is high. Accordingly, the electrodeposition coating of the present invention is useful for the preparations of printing plates, photoresist and coating of the article in which a uniform and thin film is required.

The following examples show various aspects of the invention in greater detail. It should be understood, however, that these are only illustrative. Other combinations of and variations from the embodiments shown will no doubt occur to those skilled in the art, which are considered to be part of the invention.

In the following examples, unless otherwise indicated, all parts and percentages are by weight.

EXAMPLE 1

Esterification was carried out with using a mixture of 390 parts of Epikote No. 828 (a trade name of epoxy resin made by Shell International Chemicals Corp.) and 1120 parts of linseed oil fatty acid at 220 to 230°C in the presence of nitrogen gas until the acid value became less than 10. Thereafter, the temperature was lowered to 80°C and 392 parts of maleic anhydride was added, then the temperature was gradually raised again to 230°C and the reaction with said maleic anhydride was continued at the same temperature for about 2 hours. Then the temperature was lowered to 180°C and n-butanol is an amount of 300 parts was added to cause the ring opening of the acid anhydride group, thereby the vehicle component (acid value: about 100, unsaturation equivalent: about 250 and number average molecular weight: about 2000) of the present invention was obtained.

The above vehicle component was dissolved into ethylene glycol monobutyl ether (hydrophilic solvent) so as to adjust the content of vehicle component at 70%, then it was neutralized by sodium hydroxide to the extent of 0.6 equivalent, and further 20% to the vehicle component of trimethylol propane trimethacrylate and 5% to the vehicle component of benzoin ethyl ether were added. Thereafter the solid content was adjusted to 10% by adding water to obtain an electrodeposition coating bath of pH 8.5.

Thus prepared electrodeposition coating bath was kept at 20°C and a steel-made school chair was immersed into the bath to be treated. Then the electrodeposition was carried out by supplying direct current of 80 volts for 2 minutes, and the coated chair was then taken out from the deposition bath and rinsed with water. Then the coating film was dried by hot air at 60°C for 10 minutes, and was irradiated with actinic rays from a high-pressure mercury lamp (4 KW) for 5 minutes to cure the coating film. Thus a smooth and uniform coating of 27 to 30 microns in thickness was obtained.

EXAMPLE 2

A mixture consisting of 134 parts of trimethylol propane, 118 parts of phthalic anhydride, 4.2 parts of trimellitic acid and 121 parts of safflower oil, was caused to react to 200°C for 8 hours in the presence of nitrogen gas to obtain the vehicle component (acid value: 50, unsaturation equivalent: about 600 and number average molecular weight: about 3000) of the invention. This vehicle component was then added with n-butanol as the hydrophilic solvent, thereby the solid content was adjusted to 80%. Then it was added with potassium hydroxide so as to neutralize 0.7 equivalent. Then, thus obtained mixture was added with 20% to the vehicle component of pigment (titanium white/carbon black = 100/1 by weight) to obtain an enamel. Further, 20% to the vehicle component of an ethylenically unsaturated compound (obtained by the addition of 1 mole of dimethylol propionic acid to 2 moles of equimolar reaction product of tolylene diisocyanate and 2-hydroxyethyl methacrylate) and 1% to the vehicle component of benzoin ethyl ether as the photopolymerization initiator were added. Thereafter, the solid content was adjusted to 10% by adding with water to obtain an electrodeposition coating bath of pH 8.5.

Then the electrodeposition coating bath was kept at 30°C and a steel-made school chair which was previously treated by conversion coating was immersed into said bath. Thereafter, the electrodeposition was carried out by supplying direct current of 100 volts for 3 minutes, and the coated chair was taken out from the bath and rinsed with water. Then the coating film was dried by hot air at 60°C for 10 minutes, and was irradiated with actinic rays from a high-pressure mercury lamp (4KW) for 5 minutes to cure the coating film. Thereby, a smooth and uniform coating of 20 to 22 microns in thickness could be obtained.

EXAMPLE 3

A mixture of linseed oil in an amount of 100 parts and maleic anhydride in an amount of 20 parts was caused to react at 230°C for 3 hours to obtain maleic oil (acid value: 80–90), then the temperature of the reaction product was lowered to 160°C and a mixture of 21 parts of vinyl toluene and 0.6 parts of dibutyl peroxide was added dropwise for 2 hours into said maleic oil. Thereafter, the mixture was aged at 220°C for 1 hour. Then, the temperature of this mixture was lowered to 160°C and 62 parts of equimolar reaction product of p-tert-butyl phenol and formaldehyde was added, and the temperature of thus obtained mixture was raised again to 230°C and mixed well for 1 hour. Thereby, the vehicle component (unsaturation equivalent: about 300, number average molecular weight: about 2000 and half-acid value: 65) of the present invention was obtained. The ring opening neutralization of the acid anhydride group (acid value: 130) of this vehicle component was carried out by adding 38.5 parts of 40% potassium hydroxide aqueous solution at 100°C. Further, it was added with 40 parts of ethylene glycol monoethyl ether (hydrophilic solvent), 40 parts of tetramethylolmethane tetramethacrylate (ethylenically unsaturated compound) and 2 parts of benzoin ethyl ether (photopolymerization initiator), and then the solid content of thus obtained mixture was adjusted to 10% by adding water to obtain an electrodeposition coating bath of pH 8.0. Then this bath was kept at 30°C and a steel-made school chair which was previously treated by conversion coating was immersed into said bath, and the electrodeposition coating was carried out by supplying direct current of 100 volts for 2 minutes. After the electrodeposition coating, the chair was taken out from said coating bath and was rinsed with water. Then it was dried by hot air at 60°C for 10 minutes, and the coating film was irradiated with actinic rays from a mercury lamp (4 KW) for 5 minutes to cure the film. Thereby, a smooth and uniform coating film of 30 to 32 microns in thickness was obtained.

Therefore, it will be understood that excellent and fine coating can be formed in accordance with the method of the present invention. It should be emphasized, however, that the specific embodiments described and shown herein are intended as merely illustrative and in no way restrictive of the invention.

What is claimed is:

1. An electrodeposition coating method of photocuring composition which comprises the steps of:
    immersing an electroconductive article into an electrodeposition coating bath which comprises, as the principal ingredients, (a) water soluble or water dispersible film forming polymerizable unsaturated resin having an acid value of 30 to 240, an unsaturation equivalent of about 250 to 2000 and a number average molecular weight of about 1000 to 6000, (b) water insoluble photopolymerization initiator, (c) a polyfunctional unsaturated compound insoluble in water, and (d) water;
    forming electrodeposition coating film on the surface of the electroconductive article by supplying electric current to the article as an anode; and
    applying actinic rays to the coating film on the article to cause the curing of the coating film by photopolymerization.

2. An electrodeposition coating method of photocuring composition as claimed in claim 1, in which said water soluble or water dispersible film forming polymerizable unsaturated resin has an acid value of 30 to 240, an unsaturation equivalent of about 250 to 2000 and a number average molecular weight of about 1000 to 6000.

3. An electrodeposition coating method of photocuring composition as claimed in claim 1, in which said water soluble or water dispersible film forming polymerizable unsaturated resin has an acid value of 60 to 110, an unsaturation equivalent of about 250 to 2000 and a number average molecular weight of 2000 to 3000.

4. An electrodeposition coating method of photocuring composition as claimed in claim 1, in which said water soluble or water dispersible film forming polymerizable unsaturated resin is one or a mixture of:
    I. an addition product which is prepared by reacting α,β-ethylenically unsaturated dibasic acids or their anhydrides with unsaturated bonds in the fatty acid chain of an ester which is prepared from epoxy resin having epoxy groups and unsaturated fatty acid;
    II. fatty acid modified alkyd resin having high acid value; and
    III. modified maleinized oil.

5. An electrodeposition coating method of photocuring composition as claimed in claim 1, in which the amount of said water insoluble photopolymerization initiator is within a range of 0.1 to 10 parts by weight of said water soluble or water dispersible film forming polymerizable unsaturated resin as solid.

6. An electrodeposition coating method of photocuring composition as claimed in claim 1, in which said electrodeposition coating bath is 6.5 to 9 in pH, 5 to 20% by weight in solid concentration and 15° to 40°C in the operation temperature.

7. An electrodeposition coating method of photocuring composition as claimed in claim 1, in which the direct current of 40 to 400 volts for about 30 seconds to 10 minutes is supplied to form electrodeposition coating film.

8. An electrodeposition coating method of photocuring composition as claimed in claim 1, in which actinic rays having an wave length of about 3000 to 5000 A is used.

9. The coating method according to claim 1 further including the steps of removing the electrocoated article from the coating bath and rinsing said article with water, drying the rinsed article with hot air, and then subjecting said article to curing by photopolymerization using actinic rays having a wave length of about 3000 to 5000 A.

10. The coating method according to claim 1 further including the step of preparing an electrodeposition coating, as recited in claim 1, wherein ingredient (c) comprises a water insoluble compound having two or more polymerizable unsaturated bonds, or a mixture of compounds, each of which has a single polymerizable unsaturated bond, said polymerizable unsaturated compounds serving to improve the curing property of the electrodeposited coating.

11. The coating method according to claim 10 wherein said polyfunctional unsaturated compound is a reaction product having conjugated or non-conjugated double bonds, said reaction product being modified with an ethylenically unsaturated compound taken from the group consisting essentially of styrene, vinyl toluene, cyclopentadiene, acrylic ester, and methacrylic ester.

* * * * *

UNITED STATES PATENT AND TRADEMARK OFFICE
CERTIFICATE OF CORRECTION

PATENT NO. : 3,954,587
DATED : May 4, 1976
INVENTOR(S) : Tomoo Kokawa

It is certified that error appears in the above-identified patent and that said Letters Patent are hereby corrected as shown below:

Column 6, line 14, change "is" to --in--;

Claim 11, line 7, after "ester" delete "and";

Claim 11, line 8, after "ester" insert --or the like--.

Signed and Sealed this

Third Day of August 1976

[SEAL]

Attest:

RUTH C. MASON
*Attesting Officer*

C. MARSHALL DANN
*Commissioner of Patents and Trademarks*